(12) United States Patent
Darsow et al.

(10) Patent No.: US 8,024,683 B2
(45) Date of Patent: Sep. 20, 2011

(54) REPLICATING TIMING DATA IN STATIC TIMING ANALYSIS OPERATION

(75) Inventors: Craig M. Darsow, Rochester, MN (US); Timothy D. Helvey, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 622 days.

(21) Appl. No.: 12/126,053

(22) Filed: May 23, 2008

(65) Prior Publication Data

US 2009/0293031 A1   Nov. 26, 2009

(51) Int. Cl.
G06F 9/455   (2006.01)
G06F 17/50   (2006.01)

(52) U.S. Cl. ........ 716/108; 716/106; 716/111; 716/112; 716/113; 716/134; 703/19

(58) Field of Classification Search .......... 716/106–108, 716/110–113, 132–134; 703/19
See application file for complete search history.

(56) References Cited

U.S. PATENT DOCUMENTS

| | | | |
|---|---|---|---|
| 5,210,700 A | 5/1993 | Tom | |
| 7,117,466 B2 | 10/2006 | Kalafala et al. | |
| 7,143,379 B2 | 11/2006 | Darsow et al. | |
| 7,206,958 B1 * | 4/2007 | Sutherland et al. | 713/500 |
| 2002/0116695 A1 | 8/2002 | Bou-Ghazale et al. | |
| 2003/0172361 A1 * | 9/2003 | Chiu | 716/6 |
| 2006/0277513 A1 | 12/2006 | Visweswariah | |
| 2007/0266355 A1 | 11/2007 | Cha et al. | |
| 2008/0141200 A1 | 6/2008 | Mirbeth et al. | |
| 2009/0106717 A1 * | 4/2009 | Chen et al. | 716/6 |

OTHER PUBLICATIONS

Non-Final Office Action for U.S. Appl. No. 12/126,037, mail date: Aug. 12, 2010, [9 pp].

* cited by examiner

Primary Examiner — Paul Dinh
Assistant Examiner — Nha T Nguyen
(74) Attorney, Agent, or Firm — Toler Law Group

(57) ABSTRACT

An apparatus, method and program product create multiple copies of a clock signal, or phase, to analyze timing operations within a single timing run of a static timing analysis operation. At least one path comprising logical user defined delay segments and a timing point may be associated with both a common point and no delay. An original clock signal may propagate along the logical path without incurring delay until arriving back at the common point, along with the original signal. All other clocks may be ignored or prevented from propagating long the path. Multiple replicated copies may be accomplished without requiring additional hardware.

13 Claims, 3 Drawing Sheets

REPLICATING TIMING DATA IN STATIC TIMING ANALYSIS OPERATION

RELATED APPLICATIONS

The present application relates to co-pending U.S. patent application Ser. No. 12/126,037, entitled "Concurrently Modeling Delays Between Points in Static Timing Analysis Operation" by the present inventors, Craig M. Darsow and Timothy D. Helvey. The co-pending application is filed concurrently herewith, and is incorporated by reference in its entirety.

FIELD OF THE INVENTION

The present invention relates generally to integrated circuits, and more specifically, regards the static timing analysis of integrated circuit designs.

BACKGROUND OF THE INVENTION

The proliferation of modern electronics is due in large part to the development of the integrated circuit. Integrated circuits allow many different circuit elements to be implemented on a single microchip. As technology advances, the number of circuit elements on a microchip continues to increase, which enhances the performance and reduces the cost of integrated circuits.

The design of integrated circuits is typically performed in three stages. The first stage includes logic design, where the desired operation of the integrated circuit is defined. The second stage, logic synthesis, involves translating the desired operation into the required circuit elements for a given technology. The third stage is physical design, which assigns the placement of these elements. Physical design also determines routing, which creates the wire interconnect of these elements on the integrated circuit.

Integrated circuits have traditionally been characterized by the clock frequency at which they operate. Gauging the ability of a circuit to operate at the specified speed requires the ability to measure its delay at numerous steps during the design process. Moreover, delay calculation must be incorporated into the inner loop of timing optimizers at various phases of the design, such as logic synthesis, layout (placement and routing), and in in-place optimizations performed late in the design cycle.

Some logic designs contain complex delay elements whose delay is a function of the state of the logic, rather than just a static value. In a synchronous digital system, data is supposed to move in lockstep, advancing one stage on each tick of the clock signal. This is enforced by synchronizing elements such as flip-flops or latches, which copy their input to their output when instructed to do so by the clock.

Many of the common problems in chip design relate to interface timing between different components of the design. The time when a signal arrives can vary for many reasons. For instance, the input data may vary, and/or the circuit may perform different operations. The temperature and voltage may change, the clock signal may be at an optimized frequency, and/or there may be manufacturing differences in the exact construction of each part. Other problems may stem from the simulation model being incomplete, or there may be a lack of test cases to properly verify interface timing. Synchronization requirements may vary, and/or there may be incorrect interface specifications, among other considerations.

Examples of problems that can occur from poor timing include a hold time violation, when a signal arrives too early and advances one clock cycle before it should. Another problem includes a setup time violation, when a signal arrives too late and misses the time when it should advance.

At the logic synthesis stage of integrated circuit design, a static timing tool is typically used to perform a static timing analysis to compute the expected timing of a digital circuit without requiring simulation. Static timing analysis generally takes into account best-case and worst-case delays of various circuit elements, thereby generating a list of problems that need to be corrected. As such, static timing analysis plays a vital role in facilitating the fast and reasonably accurate measurement of circuit timing.

The main goal of static timing analysis is to verify that despite possible variations, all signals will arrive neither too early nor too late, and hence proper circuit operation can be assured. In static timing analysis, the word static alludes to the fact that the timing analysis is carried out in an input-independent manner, and purports to find the worst-case delay of the circuit over all possible input combinations.

As previously stated, behavior of an electronic circuit is often dependent on various, variable factors in its environment. In such a case, either static timing analysis needs to be performed for more than one such set of conditions, or it must be prepared to work with a range of possible delays for each component, as opposed to a single value. If the design works at each extreme condition, then under the assumption of monotonic behavior, the design is also qualified for all intermediate points.

EinsTimer, developed by International Business Machines Corp. (IBM), uses a statistical engine to apply static timing analysis to critical paths in designs in order to derive models that are more silicon-accurate than most models used in static analysis. The models derived from the EinsTimer tool can then be applied to the rest of the paths in the design, improving the design's overall performance over traditional static timing analysis. Performance gain obtained will depend upon the chip and the length of paths on the chips.

EinsTimer additionally accounts for sources of variation and how the cells in the library have delays that depend on these process parameters. A characterization tool is used that analyzes every cell in the library to understand the sensitivity of cell delays to process. The characterization tool then outputs a modified library file that is used by the statistical tool for analysis. Reports and yield plots are also output in order to help users to better understand their design. For example, users can employ the tool after they have routed their design and created a clock tree in order to understand sensitivity to metal issues and transistor parameters. This feature provides designers with an idea of how robust their design is, and thus, what kind of yield to expect on a particular design. The design can then be modified to improve these timing characteristics prior to tapeout.

While the EinsTimer and other static timing analysis tools provide valuable information and are useful in the design of integrated circuits, these processes currently require significant amounts of processing and memory resources. For instance, a designer may wish to model the effects of multiple clock signals in a timing run. In one example, it may be desirable to see the affects of using clock signals with multiples of the same frequency. As such, different clock signals must be generated individually for use in modeling. Each individually generated clock signal, or phase, must then be separately modeled in a static timing analysis run. The generation and modeling phases can consume a considerable amount of the designer man-hours and computer resources.

Therefore, what is needed is a way to generate and analyze timing data in a manner that minimizes the computing resources, time or money costs conventionally associated with static timing analysis.

SUMMARY OF THE INVENTION

The present invention provides an improved computer implemented method, apparatus and program product for conducting static timing analysis on an integrated circuit design by replicating an original clock signal, and using the replicated clock signal within a static timing analysis operation associated with an integrated circuit design. The original clock signal may be replicated within a span of a timing run.

Embodiments consistent with the invention may create a logical path configured to convey a signal. The logical path may be associated with zero delay, and may comprise user defined timing points and delay segments. The logical path may include a point traversed by the original clock signal. In one embodiment, the logical path may loop back to the point.

According to an aspect of the invention, the replicated clock signal may be generated by propagating the original signal through the logical path. The replicated signal(s) may then be renamed. The original clock signal may be concurrently propagated through another path. Another signal may be disassociated from the logical path. Both the original and replicated clock signals may be output.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

DETAILED DESCRIPTION

Figure 1:
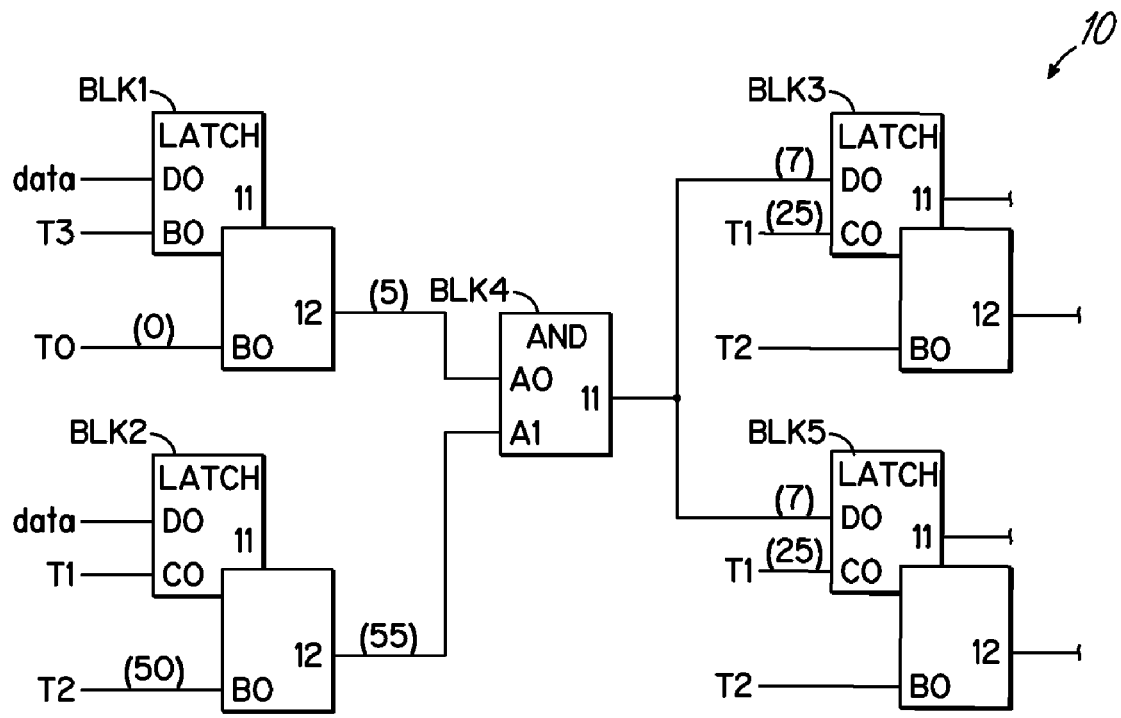
FIG. 1 is a representation of an integrated circuit design for purposes of illustrating static timing analysis processes consistent with the principles of the present invention.

Embodiments consistent with the underlying principles of the present invention may create multiple copies of a clock signal, or phase, to analyze timing operations within a single timing run of a static timing analysis operation. At least one path comprising logical user defined delay segments and a timing point may be associated with both a common point and no delay. An original clock signal may propagate along the logical path without incurring delay until arriving back at the common point, along with the original signal. All other clocks may be ignored or prevented from propagating long the path. Multiple replicated copies may be accomplished without requiring additional hardware. That is, embodiments consistent with the invention may be realized through software applications.

Cloned copies of the clock signal may preserve times and slews, as well as transition and arrival times, including early and late arrival times and any uncertainty included therein. Slew may generally relate to transition features of a signal, and/or may regard a differential in voltage with respect to a differential in time. As such, the replicated clock signal may include the frequency and all other characteristics of the original clock signal. The replicated copies may then be manipulated or otherwise used in static timing analysis operations.

Many microchips have multiple operating configurations, or modes, associated with different signal delays and/or clock frequencies. It is often the case that no one configuration can be logically shown to be the most constraining for all timing tests. Static timing analysis should consequently be accomplished for all configurations. Making separate static timing analysis runs for each configuration often consumes a troublesome amount of computing resource and elapsed time. Embodiments consistent with the invention facilitate modeling the behavior of several configurations in a single timing run. A timing run may coincide with signal propagation through and output from a timing analysis tool during static timing analysis.

Aspects of the invention may achieve consolidated timing runs by selecting a particular timing point that is common to all configurations of the design. Embodiments may then replicate all the timing information regarding a signal arriving at that point. Unique names may be associated with each replica of the information. Each of the replicated signals may propagate downstream through unique parts of the design.

In this manner, the timing data, i.e., the clock, may be replicated. Put another way, the phase is cloned. The most constraining results of timing on any of the replicas may be used by the designer to determine the limitations of the microchip. Such limitations and capabilities may be determined within a single timing run. This feature improves upon conventional static timing analysis, where an absence of cloned phases requires that multiple configurations be analyzed in multiple timing runs. Embodiments enable the cloning of an infinite number of phases, or clocks, at a single point without any loss in accuracy of analysis or changes to the hardware design to accommodate the timing tool limitations.

As discussed herein, static timing analysis tools offer a mechanism to permit users to create arbitrary paths and set arbitrary delays on these paths using user scripts. This mechanism may be referred to as a user defined delay segment (UDDS). UDDSs may be used to override delay values normally provided by timing rules, or to create non-physical paths that model something outside the timing rules. The same clock, or phase, is applied to any signal processed through the UDDS.

Related to the UDDSs, static timing analysis tools consistent with embodiments of the invention may include a user defined timing point (UDTP). UDTPs enable users to create arbitrary, logical points that may serve as starting or ending points for UDDSs. UDTPs may be executed at any timing operation, such as timing assertions, in similar fashion to automatically created timing points that correspond to physical locations within the design.

Embodiments consistent with the invention may use sequences of alternating UDDSs and UDTPs to accomplish several operations on timing data, even where the timing tool does not allow those manipulations to be done on any one single hardware point. By incorporating this feature, static timing analysis tools consistent with the invention may accomplish an infinite cloning of phases.

In one example of an embodiment of the invention, two UDTPs and three UDDSs are created. The UDTPs and UDDSs may be configured such that the timing information is associated with an original signal, ORIGINAL_CLOCK. The original signal may arrive at a physical hardware point, REAL_POINT. The original signal may be passed to the UDTPs without any changes in values. The original signal may then be attached to a new name, NEW_CLOCK_1. The NEW_CLOCK_1 signal may then be fed back to the REAL_POINT so it can propagate downstream along side ORIGINAL_CLOCK. This process results in a cloned phase. The configuration of these UDTPs and UDDSs and the manipulations done at each point are described herein.

Embodiments may produce multiple, cloned phases using the sequence below. The sequence may be repeated as many times as needed to accommodate all phases desired to be cloned. Continuing with the example above, an exemplary sequence includes creating two UDTPs, named UDTP_X_1 and UDTP_Y_1. A UDDS may be created from REAL_POINT to a UDTP_X_1. A zero delay may be assigned to this UDDS.

An embodiment of the invention may create a UDDS from UDTP_X_1 to UDTP_Y_1, and assign a zero delay to this segment. Another UDDS may be created from UDTP_Y_1 to REAL_POINT. Zero delay may be assigned to this segment.

At UDTP_X_1, an embodiment may programmatically apply a don't care assertion to clear away all information about NEW_CLOCK_1 arriving from REAL_POINT. At UDTP_Y_1, embodiments may apply a phase rename assertion that reassigns the name NEW_CLOCK_1 to all the data originally associated with the name ORIGINAL_CLOCK.

Where desired, embodiments may designate UDDSs such that they cannot be automatically removed. Such designations may be necessary where a static timing tool is configured to delete segments to avoid loops or other potential problems.

Of note, the timing values on NEW_CLOCK_1 may be independent of NEW_CLOCK_1 at REAL_POINT, and may depend solely upon the timing data associated with ORIGINAL_CLOCK. By design, the timing values may be identical, or cloned, to the values of ORIGINAL_CLOCK. Any number of additional copies of ORIGINAL_CLOCK at REAL_POINT may be achieved by repeating the above steps using different UDTPs and phase names.

As discussed herein, the logic design of a circuit is evaluated in static timing analysis to identify timing problems in the design. The logic design may be analyzed by propagating cumulative path delays from the inputs of the circuit to its outputs in a single pass, or run. The delay may comprise the time it takes for a signal to travel between first and second points, which may correspond to a one or more elements of a circuit. A timing problem may be indicated at a point in the circuit which joins two circuit paths when the signal along one of the paths arrives at the point with an improper timing relationship to the signal along the second path.

Static timing analysis thus concerns a point-by-point analysis of a logic circuit in which all possible paths to the current point are analyzed to detect timing problems. This is contrasted with dynamic timing analysis, in which logic circuit operation is simulated. Static timing analysis proceeds by propagating maximum delays from the inputs to the outputs of a design in a single pass through the design. Assuming that the design includes clocked elements such as latches, the single pass analysis means that such elements would be clocked only once during the analysis. Latches are used commonly in many various types of integrated circuits for the temporary storage of signals between circuit elements and for interfacing to external circuitry. Latches are transparent when open, and latch the data when closed.

If data is generated at the output pin of the clocked element, or source element, later than it is expected to be clocked into the input pin of the next downstream clocked element, or sink element, the data will appear to be too late from the standpoint of the sink latch. This anomaly is resolved by making a timing adjustment to the delay value that is propagated out of the output pin of the source latch. For instance, a clock cycle may be subtracted from the delay value.

An example of how timing adjustments are made within a static timing analysis environment is shown in FIG. 1. FIG. 1 illustrates a logic circuit design 10 consisting of a plurality of circuit components, or blocks. Each block represents a particular kind of logic element and includes one or more input ports on its left-hand side, and one or more output ports on its right-hand side.

Two exemplary circuit components are illustrated in FIG. 1. Blocks (BLKS) 1, 2, 3 and 5 are clocked circuit components, e.g., latches. Each latch may include two elements. The first element may comprise a data input pin D0, a clock input pin C0 and an output pin 11. The second element has a data input internally connected to the first element, and uses the B0 input pin for clocking into the second element. Each latch may be fed a clock signal consisting of two clock waveforms. Data presented to the D0 input enters the first element while the clock input to the C0 input pin has a positive level. The data is latched, or retained, in the first element at the rising edge of the clock input to the C0 pin. The data in the second element is thus available as the output at the next rising edge of the clock waveform at the B0 input pin. In FIG. 1, block 4 represents an AND gate with two input pins A0, A1 and a single output pin 11. A clock signal of an embodiment of the invention may comprise a signal that includes timing data.

Figure 2:
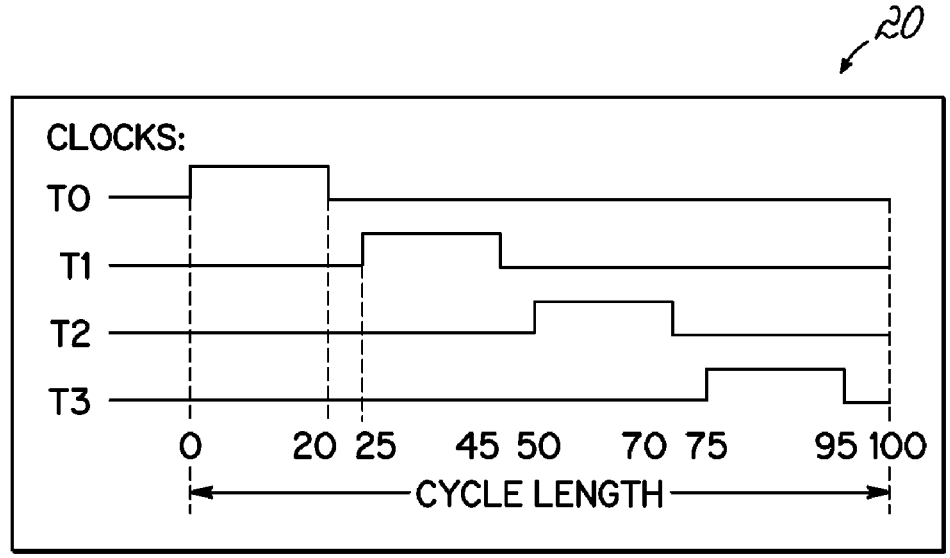
FIG. 2 is a set of clock waveforms 20 illustrating a multiphase clock that synchronizes operations of clocked elements of the integrated circuit design illustrated in FIG. 1.

The logic design of FIG. 1 employs multi-phase system clocking in which the operations of clocked components are controlled by a plurality of clock signals. Such clock signals are illustrated in FIG. 2. The clock signals may comprise manipulated copies of an original signal that was replicated in accordance with the underlying principles of the present invention. The shown clock signals are interlaced in that they have the same frequency, but separate, respective phases. FIG. 2 illustrates four clocks T0, T1, T2, and T3. One system clock cycle of the logic design of FIG. 1 comprises an interlaced sequence of four staggered clock pulses, one from each of the respective clock signals T0-T3. The cycle length is 100 timing units. Each clock signal has a pulse width of 20 timing units from rising to falling edge. As shown, the falling edge of each clock signal is separated from the rising edge of the next clock signal by five timing units.

In terms of FIG. 1, one goal of static timing analysis is to determine whether any timing problems exist between a data signal input to the input pin D0 of block 3 and the T1 clock input to the C0 input of the block. The analysis regards the arrival time of a signal produced from the output pin of block 4 with respect to the occurrence of the rising edge of the T1 clock. If the arrival time of the data signal precedes the rising edge of the T1 clock, the signal will be latched. Otherwise, the rising edge of the T1 will latch an incorrect signal into the block. The output pin of block 4 produces the signal in response to signals produced by block 1 and block 2. Each of these signals has respective delay characteristics, and either can affect the output of block 4. Therefore, the timing analysis with respect to block 3 must take into consideration the fact that the output of block 4 can change at different times, depending upon the outputs of blocks 1 and 2.

Figure 3:
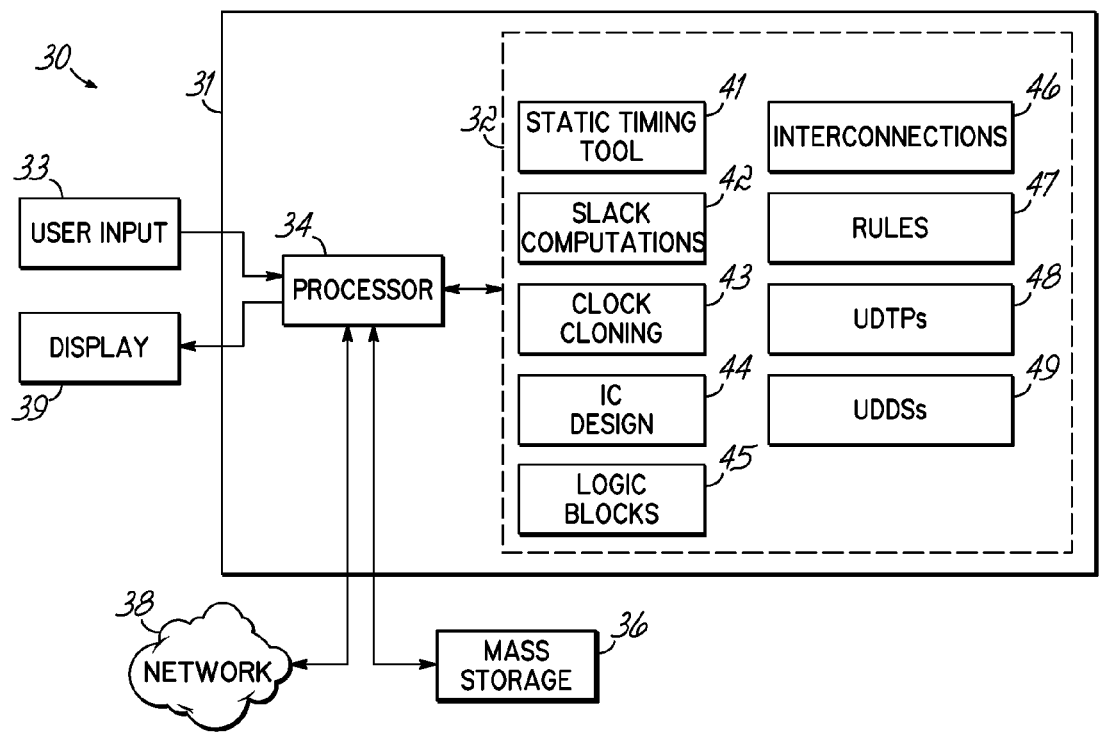
FIG. 3 is a block diagram of a networked computer system configured to replicate a number of clock signals in accordance with the underlying principles of the present invention.

While the principles of this invention do not limit its forum or application, one desirable concurrent delay modeling embodiment capitalizes on the structure available through the system exemplified in FIG. 3. FIG. 3 generally shows a block diagram of a networked computer system 30 configured to concurrently model a plurality of signals having varying delays within the span of a single static analysis timing run. One such system may include an IBM Server i computer system. Those skilled in the art, however, will appreciate that the mechanisms and apparatus of the present invention apply equally to virtually any other computer system.

The system 30 more particularly comprises one or more client computers 31 coupled to a network 38. Network 38 represents a networked interconnection including, but not limited to local area, wide area, wireless, and public networks (e.g., the Internet). Moreover, any number of computers and other devices may be networked through network 38, e.g., multiple servers.

Computer system 30 will hereinafter also be referred to as an "apparatus," "computer," "tool," "device," or "system," although it should be appreciated that the terms may respectively include many other controller configurations. Moreover, while only one network interface device is shown in FIG. 1, any number of computers and other devices may be networked through network 38. In still another embodiment, the system 30 may be implemented in a standalone configuration, i.e., disconnected from another computer or computer network.

Computer device 31 typically includes at least one processor 34 coupled to a memory 32. Processor 34 may represent one or more processors (e.g., central processing units, microprocessors). Memory 32 may represent the SRAM devices comprising the main storage 32 of computer device 31, as well as any supplemental levels of memory, e.g., cache memories, non-volatile or backup memories (e.g., programmable or flash memories), read-only memories, etc. In addition, memory 32 may be considered to include memory storage physically located elsewhere in computer device 31, e.g., any cache memory present in processor 34, as well as any storage capacity used as a virtual memory, e.g., as stored within a database 37, or on another computer coupled to computer device 31 via network 38.

Computer device 31 also may receive a number of inputs and outputs for communicating information externally. For interface with a user, the computer system 30 typically includes one or more input devices 33 (e.g., a keyboard, a mouse, a trackball, a joystick, a touch pad, iris/fingerprint scanner, and/or a microphone, among others). The computer system 30 additionally includes a display 39 (e.g., a CRT monitor, an LCD display panel, and/or a speaker, among others). It should be appreciated, however, that with some implementations of the computer system 30, direct user input and output may be unsupported by the computer device 31, and interface with the server computer device 31 may be implemented through a computer or workstation networked with the computer device 31.

For additional storage, computer system 30 may also include one or more mass storage devices 36 configured to store, for instance, the database 37. Exemplary devices 36 can include: a floppy or other removable disk drive, a flash drive, a hard disk drive, a direct access storage device (DASD), an optical drive (e.g., a CD drive, a DVD drive, etc.), and/or a tape drive, among others. Furthermore, computer system 30 may include an interface with one or more networks (e.g., a LAN, a WAN, a wireless network, and/or the Internet, among others) to permit the communication of information with other computers coupled to the network 38. It should be appreciated that computer system 30 typically includes suitable analog and/or digital interfaces between processor 34 and each of components 32, 33, 36, 38 and 39.

Computer device 31 may operate under the control of an operating system 40, and executes various computer software and hardware applications, components, programs, modules, e.g., a main memory storage 32, a static timing tool 41, a slack computations algorithm 42, a clock cloning algorithm 43 and an integrated circuit design 44. An integrated circuit design 44 suitably includes or otherwise accesses logic blocks 45, interconnections 46 and rules 47. UDTPs and UDDSs are represented at blocks 48 and 49, respectively.

The logic blocks 45 may comprise basic building blocks that include transistor structures that define circuit components, such as gates and latches. The interconnections 46 may include the connections between the logic blocks 45. The rules 47 may define the performance for the integrated circuit design, and are based on the selected technology for the integrated circuit. The rules 47 may suitably specify the size of a logic block, and the best-case and worst-case delay characteristics of signals within the logic blocks and between logic blocks.

The static timing tool 41 may perform static timing analysis on an integrated circuit design 44. The static timing tool 41 may perform a plurality of slack computations 42 that define whether there is a timing problem for data setup between pins on a logic block in the integrated circuit design. Slack is a non-negative number if the data setup time is satisfied, with the value indicating how much play, or slack, exists before the timing is violated. If slack is zero, the data setup time is satisfied, but just barely. If slack is negative, the data setup time is not satisfied, and the value indicates how bad the problem is. For example, a slack value of negative four indicates that, under worst-case timing assumptions for data setup time, the clock could occur four time units before the data is guaranteed to be valid.

The operating system 40 may comprise a multitasking operating system, such as OS/400, AIX, or Linux; however, those skilled in the art will appreciate that the spirit and scope of the present invention is not limited to any one operating system. Any suitable operating system may be used.

The computer system 30 utilizes well known virtual addressing mechanisms that allow the programs of computer system 30 to behave as if they only have access to a large, single storage entity instead of access to multiple, smaller storage entities such as main memory 32 and mass storage 36. Therefore, while the operating system 40, static timing tool 41, slack computations algorithm 42, clock cloning algorithm 43, integrated circuit design 44, logic blocks 45, interconnections 46 and rules 47 are shown to reside in main memory 32, those skilled in the art will recognize that these items are not necessarily all completely contained in main memory 32 at the same time, or at all. It should also be noted that the term "memory" is used herein to generically refer to the entire virtual memory of computer system 30.

Various applications, components, programs, markers, modules, etc. may also execute and/or be stored on one or more processors and/or memory of another computer coupled to computer device 31 via a network 38, e.g., in a distributed or client-server computing environment, whereby the processing required to implement the functions of a computer program may be allocated to multiple computers over a network.

Moreover, while computer device 31 may include a networked computer device, other embodiments of the device 31 may include relatively smaller and more focused computing applications or components, such as a cellular phone, a PDA or a microchip. In one embodiment, the computer system 30 may comprise a static timing analysis tool, such as IBM's EinsTimer. The system 30 may thus automatically analyze the timing of an integrated circuit design at each node in a design 10. In one implementation, the system 30 may generate slack computations in an integrated circuit design 10, such as shown in FIG. 1. The system 30 may then determine which logic blocks in the integrated circuit design 10 have data launch and clock test signals on the same edge.

The system 30 may identify a set of common blocks through which both clock test and data launch signals pass. The system 30 may then compute the difference between the slowest and fastest delay through the common blocks. A negative number on the slack indicates a timing problem, because the clock can conceivably occur under best-case timing assumptions when the data is not yet present under worst-case timing assumptions. The slack may be adjusted by the difference computed.

In general, the routines executed to implement the embodiments of the invention, whether implemented in hardware, as part of an operating system, or as a specific application, component, program, engine, process, programmatic tool, object, module or sequence of instructions, or even a subset thereof, may be referred to herein as an "algorithm," "function," "program code," or simply "program." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. One of skill in the art should appreciate that embodiments consistent with the principles of the present invention may nonetheless use program code resident at only one, or any number of locations.

Moreover, while the invention has and hereinafter will be described in the context of fully functioning computer systems, those skilled in the art will appreciate that the various embodiments of the invention are capable of being distributed as a program product in a variety of forms, and that the invention applies equally regardless of the particular type of computer readable, signal bearing media used to actually carry out the distribution. Examples of signal bearing, computer readable media include, but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application or engine within which it is implemented in a specific embodiment of the invention. However, it should be appreciated that any particular program nomenclature that follows is used merely for convenience, and thus the invention should not be limited to use solely in any specific application or engine identified and/or implied by such nomenclature.

Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

The various software components and resources illustrated in FIG. 1 may be implemented in a number of manners, including using various computer software applications, routines, components, programs, objects, modules, data structures and programs. Those skilled in the art will further recognize that the exemplary environments illustrated in FIG. 1 are not intended to limit the present invention. Indeed, those skilled in the art will recognize that other alternative hardware and/or software environments may be used without departing from the scope of the invention.

Figure 4:
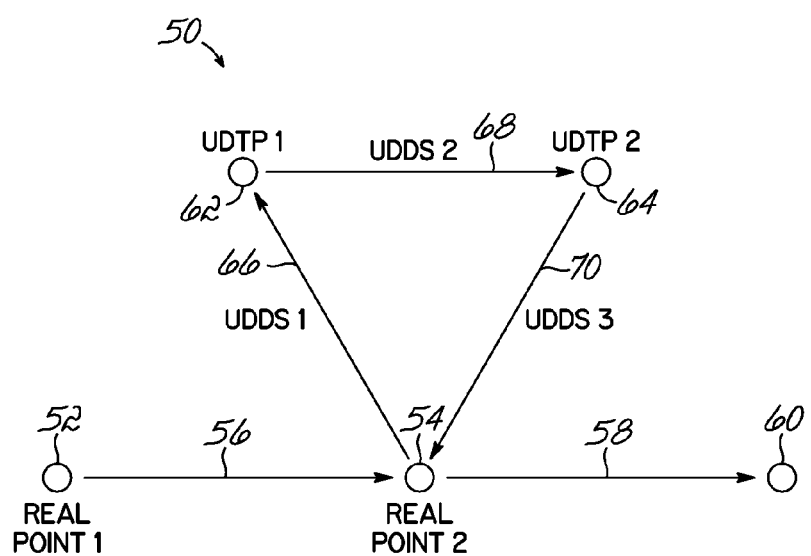
FIG. 4 is a graphical representation of a process for replicating a number of clock signals within a single timing run of a static timing analysis in accordance with the underlying principals of the present invention.

FIG. 4 is a pictorial representation 50 showing a manner in which a clock signal may be programmatically replicated in accordance with the underlying principles of the present invention. More particularly, FIG. 4 shows a first real point 52 that connects to a second real point 54. The real points 52, 54 may correspond to actual points on an integrated circuit design 10. For instance, the points 52, 54 may correspond to an input and an output pin, respectively, of a buffer of a state machine. Line 56 of FIG. 4 represents a physical path between the real points 52, 54. Point 60 of FIG. 4 may correspond to cloned clock signals output in accordance with the underlying principles of the present invention and traveling over communication channel 58.

The representation 50 of FIG. 3 also includes first and second UDTPs 62, 64, respectively. A first UDDS 66 logically connects the real point 54 to the first UDTP 62. A second UDDS 68 logically connects the first UDTP 62 to the second UDTP 64. Finally, a third UDDS 70 logically connects the second UDTP 64 to the real point 54.

Figure 5:
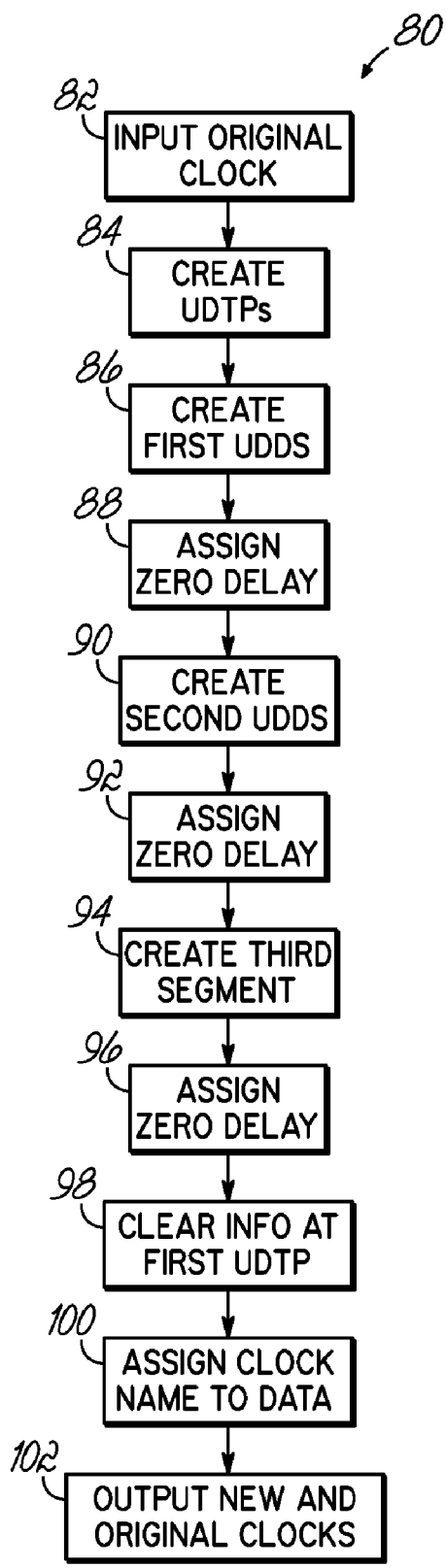
FIG. 5 is a flowchart having steps executable by the system of FIG. 3 for replicating a number of clock signals within a single timing run of a static timing analysis in accordance with the underlying principals of the present invention.

FIG. 5 is a flowchart 80 showing steps executable by the system 30 of FIG. 3 for replicating clock signals within a single static timing analysis run in accordance with the underlying principles of the present invention. Turning more particularly to the flowchart 80, the system 30 may receive user input at block 82 regarding an original clock signal. It may be desirable to clone multiple copies of the clock signal. To this end, the system 30 may prompt the user to create at block 84 first and second UDTPs 62, 64.

The system 30 may then create a first UDDS 66 at block 86. The user may access the system 30 to assign at block 88 a zero delay to the first UDDS 66. The system 30 may create at block 90 a second UDDS 68. As before, a zero delay value may be assigned at block 92 to the second UDDS 68.

The system 30 may then create a third UDDS 70 at block 94. The system 30 may assign at block 96 a zero delay value to the third UDDS 70. All residual clock information at the first UDTP 62 may be cleared at block 98. In this manner, all but one signal may be disassociated with the logical path comprising UDDSs 66, 68, 70. Disassociating may include preventing propagation, and/or excluding consideration of signal propagation in terms of static timing analysis. The user may be prompted by the system to assign at block 100 a clock name to the data. The system 30 may then output at block 102 the original and cloned clock signals.

While the present invention has been illustrated by a description of various embodiments and while these embodiments have been described in considerable detail, it is not the intention of the Applicants to restrict, or, in any way limit the scope of the appended claims to such detail. For instance, embodiments of the invention may include a designer manipulating the frequency or other characteristic of a replicated signal to gauge the downstream affects of timing data in a static timing analysis environment. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A method for conducting static timing analysis on an integrated circuit design, the method comprising:
   replicating an original clock signal to generate a replicated clock signal by using a computer to assign no delay to a logical path comprising a user defined delay segment coupled to a plurality of user defined timing points, wherein the original clock signal and the replicated clock signal have the same slew;
   wherein at least one of the plurality of user defined timing points includes a point traversed by the original clock, configuring the logical path to loop back to the point;
   generating the replicated clock signal by propagating the original clock signal through the logical path;
   wherein the original clock signal and the replicated clock signal are concurrently modeled within a span of a timing run; and
   using the replicated clock signal within a static timing analysis operation associated with an integrated circuit design.

2. The method of claim 1 further comprising replicating the original clock signal multiple times.

3. The method of claim 1 further comprising creating the logical path.

4. The method of claim 3 further comprising associating no delay to a second logical path to generate a second replicated clock signal.

5. The method of claim 1 further comprising naming the replicated clock signal.

6. The method of claim 1 further comprising concurrently propagating the original clock signal through another logical path.

7. The method of claim 1 further comprising disassociating another signal from the logical path.

8. The method of claim 1 further comprising creating the logical path.

9. The method of claim 1, further comprising outputting both the original and replicated clock signals.

10. An apparatus, comprising:
    a processor;
    a memory in communication with the processor and storing an integrated circuit design; and
    program code resident in the memory, the program code configured to replicate an original clock signal to generate a replicated clock signal by assigning no delay to a logical path comprising a user defined delay segment coupled to a plurality of user defined timing points, wherein the original clock signal and the replicated clock signal have the same slew, wherein at least one of the plurality of user defined timing points includes a point traversed by the original clock, configure the logical path to loop back to the point, generate the replicated clock signal by propagating the original clock signal through the logical path, and to use the replicated clock signal within a static timing analysis operation associated with the integrated circuit design; and wherein the original clock signal and the replicated clock signal are concurrently modeled within a span of a timing run.

11. The apparatus of claim 10, wherein the program code is further configured to create the logical path.

12. The apparatus of claim 11, wherein the program code is further configured to disassociate another clock signal from the logical path.

13. A program product embodied in a non-transitory computer readable medium, which when executed by a computer, perform a static timing analysis on an integrated circuit design, comprising:
    program code configured to replicate an original clock signal to generate a replicated clock signal by assigning no delay to a logical path comprising a user defined delay segment coupled to a plurality of user defined timing points, wherein the original clock signal and the replicated clock signal have the same slew, wherein at least one of the plurality of user defined timing points includes a point traversed by the original clock, configure the logical path to loop back to the point, generate the replicated clock signal by propagating the original clock signal through the logical path, and to use the replicated clock signal within a static timing analysis operation associated with an integrated circuit design; and
    wherein the original clock signal and the replicated clock signal are concurrently moldeled within a span of a timing run.

* * * * *